METHOD OF MANUFACTURING A SEMICONDUCTOR DEVICE

Filed Aug. 19, 1970 3 Sheets-Sheet 1

Aug. 27, 1974 TOSHIRO MATSUI ET AL 3,832,225

METHOD OF MANUFACTURING A SEMICONDUCTOR DEVICE

Filed Aug. 19, 1970 3 Sheets-Sheet 3

United States Patent Office 3,832,225

Patented Aug. 27, 1974

3,832,225

METHOD OF MANUFACTURING A SEMICONDUCTOR DEVICE

Toshiro Matsui, Tokyo, Masashi Nakagawa, and Tadashi, Utagawa, Yokohama, and Makoto Tokunaga, Tokyo, Japan, assignors to Tokyo Shibaura Electric Co., Ltd., Kawasaki-shi, Japan Filed Aug. 19, 1970, Ser. No. 65,262
Claims priority, application Japan, Aug. 21, 1969, 44/65,681
Int. Cl. B44d *1/18*
U.S. Cl. 117—212 2 Claims

ABSTRACT OF THE DISCLOSURE

A method of manufacturing a semiconductor device in good reproducibility and yield which comprises providing a single crystal semiconductor substrate of zinc blende type having a (001) plane in which a <001> orientation is defined as a fourfold rotation inversion axis, coating the (001) plane with a protective film, removing by means of a reaction-limited etching solution that part of the protective film which is disposed between two straight lines parallel with the direction in which the aforementioned (001) plane can be etched at a uniform speed so as to form an etched groove, and forming an epitaxially grown layer of another single crystal semiconductor in the etched groove.

The present invention relates to a method of manufacturing a semiconductor device and more particularly to a method which comprises defining the crystalllographic orientation of a single crystal semiconductor substrate of zinc blende type, etching in the substrate a groove whose bottom and side walls intersect each other at right angles and which itself also assumes a perpendicular position with respect to the plane of the substrate, and selectively forming in the etched groove an epitaxially grown layer of another single crystal semiconductor.

A semiconductor device such as a lateral type Gunn diode, field effect transistor, electro-luminating semiconductor device or photo diode is generally prepared by etching a groove in a single crystal semiconductor substrate and embedding another single crystal semiconductor in said etched groove.

For better understanding of the present invention, there will now be described by reference to FIG. 1 the conventional method of manufacturing the aforementioned type of semiconductor device from single crystal gallium arsenide (GaAs) as a typical example of a semiconductor substrate of zinc blende type. It should be noted that for convenience of description throughout the specification, a particular crystallographic orientation is denoted by a mark < >, an equivalent crystallographic orientation by [ ], a particular crystallographic plane by ( ) and an equivalent crystallographic plane by { }.

The semiconductor device of FIG. 1 is manufactured in the following manner. There is first provided a single crystal gallium arsenide (GaAs) substrate 1*a* bearing a [100] orientation. To stabilize a product semiconductor device, there is coated on the {100} plane of the substrate a protective film 2*a* consisting of, for example, $SiO_2$ or $Si_3N_4$ by thermal decomposition of compounds of Si and others. Part of the protective film is removed to expose part of the substrate and the exposed part is etched to form a groove 3*a*. In the etched groove is formed by epitaxial growth another single crystal semiconductor 4*a* of the same material as the substrate. These semiconductor materials are each provided with a lead (not shown). It has been found that there exists a certain interrelationship between the crystallographic orientation of the single crystal semiconductor along which part of the protective film 2*a* should be removed and the physico-chemical properties of an etching solution capable of etching at a uniform speed that part of the semiconductor substrate exposed by removal of the coated protective film, and that the etched groove and a single crystal semiconductor epitaxially grown therein present various forms depending on said interrelationship. In other words, if the exposed part of the semiconductor substrate is etched without previously defining the particular crystallographic orientation of said substrate and the orientation of that plane of the substrate in which etching should be performed, though using an etching solution of suitable kind or of adequate activation energy, then there will result an etched groove with a curved bottom illustrated in FIG. 1. On the other hand, where there is used an etching solution of low activation energy, though the particular crystallographic orientation of the semiconductor substrate and the orientation of that plane of the substrate in which etching should be conducted are determined in advance, then there will only result an etched groove with a curved bottom as in the preceding case. In many cases there is required, as later described with reference to FIG. 5D, an etched groove whose side walls are disposed parallel and define an angle of substantially 90° with the bottom plane. However, it has been impossible to obtain an etched groove of such form. Moreover, if, in case there is formed by epitaxial growth a single crystal semiconductor in an etched groove assuming such desired form, there is not considered the aforementioned interrelationship between the particular crystallographic orientation of the single crystal semiconductor and the physico-chemical properties of an etching solution to be used, then the upper part of the epitaxially grown layer 4*a* formed in the etched groove will project from the top plane of the semiconductor substrate in an undulated shape illustrated in FIG. 1, failing to give a flat plane. Particularly where there is prepared a lateral type Gunn diode, it is often demanded that the epitaxially grown layer 4*a* be shaped exactly as designed. To this end, the etched groove 3*a* should have a shape closely approximating the prescribed dimensions, and it is particularly desired that the upper surface of said epitaxially grown layer 4*a* be quite flat.

Heretofore, however, nothing has been known of the interrelationship between the proper crystallographic orientation of a single crystal semiconductor to meet the aforesaid requirements and the suitable physico-chemical properties of an etching solution to form a desired etched groove. It will be easily understood, therefore, that the conventional semiconductor device has been manufactured in low reproducibility and yield.

It is accordingly the object of the present invention to provide a method of manufacturing in good reproducibility and yield a semiconductor device comprising a single crystal semiconductor substrate of zinc blende type.

The method of the present invention comprises the steps of providing a single crystal semiconductor substrate of zinc blende type bearing a (001) plane in which a <001> orientation is defined as fourfold rotation inversion axis, coating the (001) plane with a protective film, removing by means of a reaction-limited solution that part of the protective film disposed between two straight lines parallel with the direction in which the (001) plane can be etched at a uniform speed so as to expose part of the (001) plane, eroding the exposed part of the (001) plane using the reaction-limited etching solution to form an etched groove, and embedding an epitaxially grown layer of another single crystal semiconductor in the etched groove.

This invention can be more fully understood from the following detailed description when taken in connection with reference to the accompanying drawings, in which.

Figure 3:
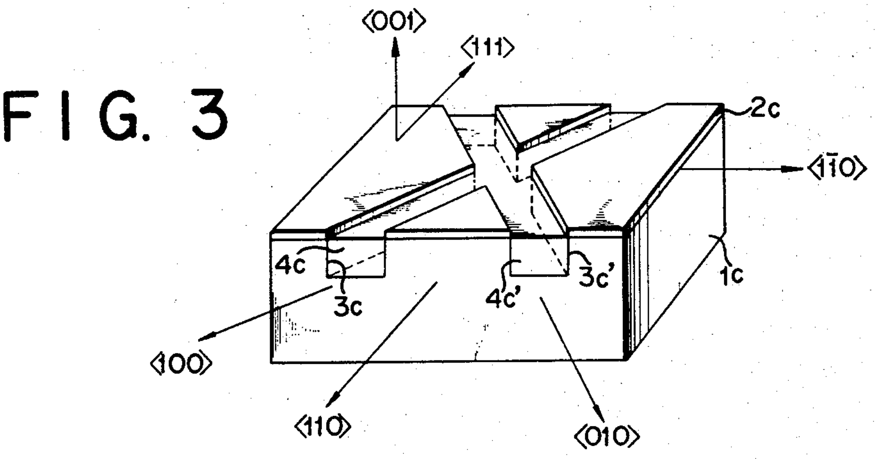
Figure 4:
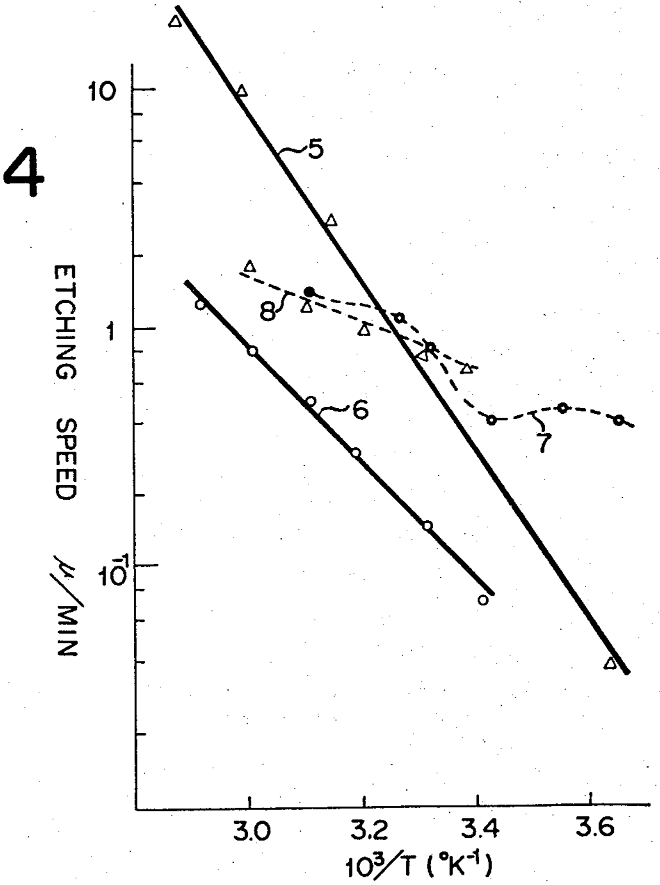

FIG. 3 pictorially illustrates a single crystal gallium arsenide substrate, protective film and etched groove involved in another embodiment of the present manufacturing method in relation to the crystallographic orientation of the single crystal substrate;

FIG. 4 is a linear diagram showing the etching speed of an etching solution used in the method of the invention; and FIGS. 5A to 5D jointly show the sequential steps of manufacturing a Gunn diode from single crystal gallium arsenide according to the method of the invention.

The single crystal semiconductor substrate used in the present invention bears a (001) plane in which the <001> orientation is defined as a fourfold rotation inversion axis. To define the meaning of the term "fourfold rotation inversion axis," as used herein, let us assume that there is a straight line in a crystal, and there are formed some given planes centered about said straight line, which include planes having the same properties. Where one of the latter planes is made to rotate through 90° about said straight line and thereafter brought to a linear symmetrical position with respect to the rotation axis, then said plane will be superposed on another plane having the same properties. Further where the first mentioned plane is subjected to the same operation three more times, then it will be brought back to its original position from which it started rotation. Said straight line is intended to mean the aforesaid "four-fold rotation inversion axis." The crystallographic plane thus defined possesses a particular orientation which enables a certain kind of etching solution to carry out etching at a uniform speed. The present inventors have discovered that said orientation is either parallel with the <110> orientation or defines an angle of 45° with the (001) plane.

On the other hand, typical etching solutions include a diffusion-limited and a reaction-limited type. The inventors have further found that where etching is carried out using a reactor-limited etching solution along that particular orientation of the single crystal semiconductor substrate bearing the (001) plane thus defined which permits etching to be effected at a uniform speed, then there can be formed an etched groove whose bottom plane is substantially flat and defines an angle of substantially 90° with the side walls. It has also been discovered that the reaction-limited etching solution should preferably have an activation energy of 10 Kcal./mol minimum and that the <001> orientation should be defined within the error of ±2°.

With absolute temperature denoted as T° $k$, Boltzmann's constant as $k$, activation energy as E (Kcal.), and reaction constant as A, then the etching speed Y ($\mu$/min.) of the reaction-limited etching solution may be expressed by the following equation:

$$Y = A \exp\left(\frac{E}{kT}\right) \qquad (1)$$

The equation (1) above may be converted as follows:

$$2.303 \log \frac{Y}{A} = -\frac{E}{k} \cdot \frac{1}{T} \qquad (2)$$

As seen from the equation (2), the relationship between the logarithm log Y of the etching speed Y and the reciprocal $1/T$ of absolute temperature may be represented by a straight line having a particular inclination.

FIG. 4 represents the results of measuring the speed at which the (100) plane of single crystal gallium arsenide was etched after said crystal was allowed to stand in various kinds of etching solution with temperature varied for each solution. The reciprocal [$10^3/T$(° K.$^{-}$)] of absolute temperature is plotted on the abscissa and the etching speed ($\mu$/min.) on the ordinate. Referring to FIG. 4, the solid line 5 represents an etching solution prepared by mixing water, hydrochloric acid and nitric acid in the volumetric ratio of 2:2:1. The solid line 6 denotes an etching solution consisting of 4% by weight of sodium hydroxide, 3.5% by weight of hydrogen peroxide and water as the remainder. The broken line 7 shows an etching solution prepared by dissolving 1% by weight of bromine in methyl alcohol. The broken line 8 indicates an etching solution prepared by mixing sulfuric acid, hydrogen peroxide and water in the volumetric ratio of 9:1:1. The etching solutions represented by the solid lines 5 and 6 are of reaction-limited type. As measured from the degree of inclination of these solid lines, the etching solution of the line 5 has an activation energy of 17 Kcal./mol and that of the line 6 has an activation energy of 12 Kcal./mol. The solution of the line 7 is of reaction-limited type, but its activation energy is less than 10 Kcal./mol and the solution of the line 8 is of diffusion-limited type.

The present invention will be more clearly understood from the examples which follow.

EXAMPLE 1

Figure 2A:
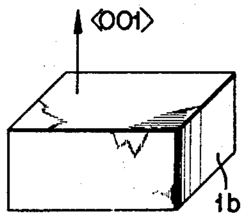
FIGS. 2A to 2E are pictorial views of a method of manufacturing a semiconductor device according to an embodiment of the present invention.
Figure 2B:
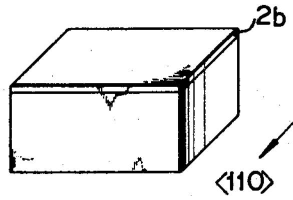
Figure 2C:
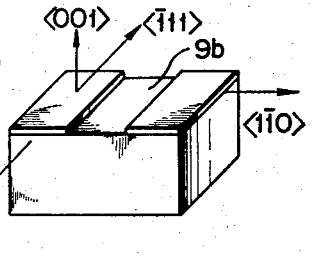
Figure 2D:
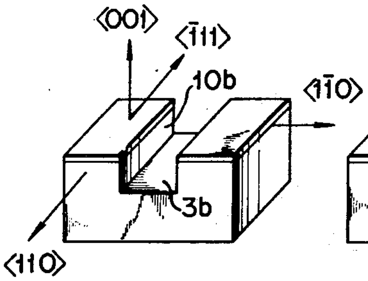

There was provided a single crystal gallium arsenide substrate 1*b* (FIG. 2A) bearing a (001) plane in which a <001> orientation is defined as a fourfold rotation inversion axis. The substrate 1*b* having its (001) plane mirror polished was 250 microns thick. The substrate 1*b* was heated 30 minutes at 640° C. in a known furnace while introducing $Si(OC_2H_5)_4$ as a carrier gas to form a protective film 26 of $SiO_2$ 3000 A. thick on the (001) plane of the substrate 1*b* (FIG. 2B). The single crystal substrate 1*b* had an orientation shown by the arrow. Part, for example, the corner of the substrate 1*b* was cut in a plane perpendicular to a <$\bar{1}$11> orientation intersecting at right angles a plane defined between a <001> orientation and a <1$\bar{1}$0> orientation, thereby forming a cut plane. After the cut plane was confirmed to be a B plane, that part of the protective film 26 which was defined between two straight lines parallel with the <110> orientation was photoetched to expose part 9*b* of the (001) plane (FIG. 2C). The exposed plane was etched to a depth of 10 microns using a reaction-limited etching solution (indicated by the solid line of FIG. 4) prepared by mixing water and hydrochloric acid, nitric acid in the volumetric ratio of 2:2:1. The resultant etched groove (FIG. 2D) assumed a substantially desired shape whose bottom plane defined an angle of substantially 90° with the side walls 10*b*, the distances between the protective film and the bottom plane of the etched groove at both side walls 10*b* being substantially equal. In contrast where there was used a diffusion-limited etching solution, there was not obtained an etched groove bearing a desired shape.

Figure 1:
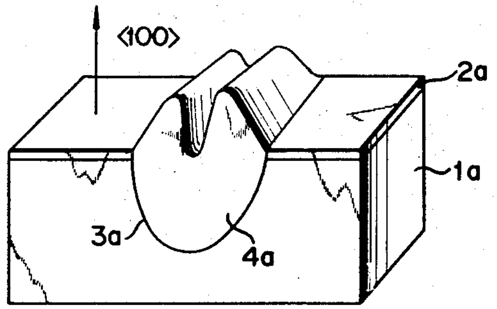
FIG. 1 is a pictorial view of a semiconductor device manufactured by the conventional method with single crystal gallium arsenide used as a substrate.
Figure 2E:
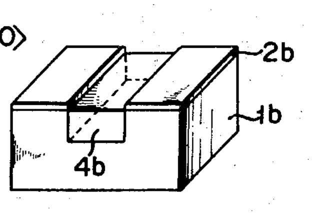

In a known furnace used in the epitaxial growth of a single crystal, there were placed a cleaned single crystal substrate provided with the aforementioned etched groove and a solid gallium piece. While the substrate and solid gallium piece were maintained at temperatures of 750° and 850° C. respectively, there were introduced $AsCl_3$ and $S_2Cl_2$ at the same time with $H_2$ used as a carrier gas across the solid gallium piece up to the position where the substrate was placed, so as to form an epitaxially grown layer 4*b* of single crystal gallium arsenide having a specific resistivity of 0.001 Ωcm. in the etched groove 3*b* (FIG. 2E). The epitaxially grown layer 4*b* was formed to the same depth of 10 microns as that of the etched groove 3*b*, but it had such a plain surface that there could be mounted an electrode thereon by photoetching without any extra processing of said surface.

Where the cut plane perpendicular to the aforesaid <$\bar{1}$11> orientation constituted an A plane instead of the B plane in the preceding case, that part of the protective film which was disposed between two straight lines parallel with the <110> orientation was removed to expose part of the (001) plane of the substrate. The exposed plane was etched 10 minutes at 27° C. using the same kind of etching solution as used in the foregoing example to form an etched groove 12 microns deep. However, the resultant etched groove had the same form as that of FIG. 1, namely, it had a narrow bottom and broad opening, or presented a substantially segmental cross section. Further, where there was formed an epitaxially grown layer in said etched groove by the same process as used in the preceding example, the surface of said layer projected about 8 microns from the top plane of the substrate like that shown in FIG. 1. Accordingly, the surface of said layer could not be photoetched to mount an electrode thereon.

As mentioned above, where part of the protective film is to be removed in parallel with the <110> orientation, the cut plane perpendicular to the <$\bar{1}$11> orientation should form a B plane. As used herein, the term "B plane" is intended to mean that plane which, when etched, does not present any pit, whereas the term "A plane" denotes that plane which, when etched, is likely to display pits. Particulars of the A and B planes are given by E. P. Warekois and P. H. Metzer in "Journal of Applied Physics, vol. 30, No. 7, pp. 960–962, July 1959."

In the foregoing example, the confirmation that the cut plane constituted a B plane was made after the substrate was coated with a protective film of $SiO_2$. Conversely, however, it is possible to carry out such confirmation before formation of the $SiO_2$ protective film.

EXAMPLE 2

There was provided (FIG. 3) a single crystal gallium substrate 1$c$ bearing a (001) plane defined in the same manner as in Example 1. The (001) plane of the substrate 1$c$ was coated with a $SiO_2$ protective film 2$c$ by the same process as used in Example 1. The various orientations of the single crystal substrate had the relative positions indicated by the arrows of FIG. 3. The <100> and <010> orientations lie in the (001) plane, and are inclined at 45° with respect to the <110> orientation present in the same plane. Accordingly, the <100> and <010> orientations intersect each other at right angles. That part of the protective film 2$c$ which was defined between two straight lines parallel with the <100> and <010> orientations was photoetched to expose part of the (001) plane of the substrate 1$c$ in the form of two bands intersecting each other at right angles. The exposed parts were etched using the same kind of etching solution as used in Example 1 to form etched grooves 3$c$ and 3$c'$ 10 microns deep intersecting each other at right angles. In each of the etched grooves 3$c$ and 3$c'$, the bottom plane defined an angle of substantially 90° with the side walls. The single crystal semiconductor substrate in which there were formed the aforementioned grooves 3$c$ and 3$c'$ was placed in the same type of furnace for epitaxial growth of a single crystal and there were formed in said grooves 3$c$ and 3$c'$ epitaxially grown layers 4$c$ and 4$c'$. The epitaxially grown layer had a plain surface, which could be directly photoetched to mount an electrode thereon.

With Example 2, it will not matter whether the plane perpendicular to the <$\bar{1}$11> orientation defined between the <001> and <1$\bar{1}$0> orientations was an A or B plane. Accordingly, there could be eliminated the step of distinguishing between these planes.

EXAMPLE 3

Figure 5A:
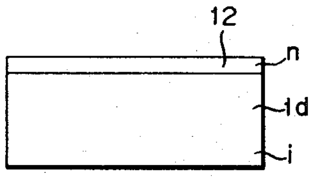
Figure 5B:
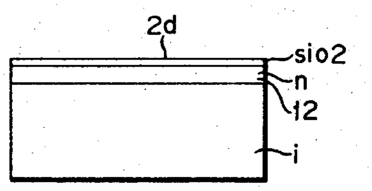
Figure 5C:
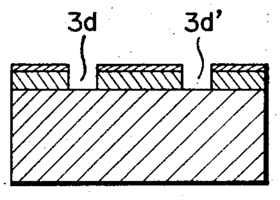
Figure 5D:
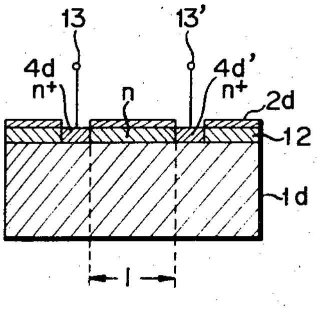

There was provided a single crystal gallium arsenide i-type substrate 1$d$ 200 microns thick which had a specific resistivity $\rho$ of $10^8$ Ωm. The various orientations of this substrate had the same relative positions as those in Example 1. There was prepared from this substrate a lateral type Gunn diode having a cross section shown in FIG. 5D. The manufacturing process ran as follows. There was formed by epitaxial growth using a known process an N type gallium arsenide layer 12 10 microns thick having a specific resistivity $\rho$ of 1 Ωcm. so as to cover the entire (001) plane of the substrate 1$d$ (FIG. 5A). The various orientations of this epitaxially grown layer 12 had the same relative positions as those of the substrate 1$d$. On the (001) plane of the epitaxially grown layer 12 was coated a protective film of $SiO_2$ 2$d$ by a known process (FIG. 5B). After the plane of the substrate 1$d$ perpendicular to its <$\bar{1}$11> orientation was confirmed to be a B plane, two parts of the protective film 2$d$ were removed parallel with the <110> orientation at a space of $l$ partly to expose the surface of an epitaxially grown layer of N type gallium arsenide 12. The exposed parts were etched by the same kind of etching solution as used in Example 1 to form grooves 3$d$ nd 3$d'$. Each etched groove had such a cross section where the side walls defined an angle of substantially 90° with the bottom plane (FIG. 5C). In the etched grooves 3$d$ and 3$d'$ were epitaxially grown $N^+$ layers 4$d$ and 4$d'$ by the same process as used in Example 1. Since the layers 4$d$ and 4$d'$ had a plain surface, there were mounted electrodes directly thereon by photoetching, from which were drawn out lead lines 13 and 13', obtaining a lateral type Gunn diode illustrated in FIG. 5D.

The oscillation efficiency of such Gunn diode is determined by a product arrived at by multiplying the concentration N of the N type epitaxially grown layer 12 by the distance $l$ between the $N^+$ type epitaxially grown layers 4$b$ and 4$b'$. Accordingly, whether the side walls of each of the etched grooves 3$d$ and 3$d'$ define an angle of substantially 90° with the bottom plane constitutes a significant factor in determining the distance $l$. In Example 3, therefore, there was realized the excellent reproducibility of the distance $l$, enabling a reproducible semiconductor device to be manufactured in good yield wherein the layer epitaxially grown in the etched groove had a flat surface.

There has been described a substrate consisting of a single crystal gallium arsenide. It will be apparent that the present invention is applicable to a semiconductor device whose substrate is prepared from other single crystals of zinc blende type such as gallium phosphide GaP. Further, the epitaxially grown layer may be formed either in vapour phase or in liquid phase.

As mentioned above, the present invention enables a groove etched in a substrate to assume a shape approximating the desired dimensions from the standpoint of manufacturing design, and a layer grown in the etched groove to have a plain surface, thereby producing a semiconductor device in good reproducibility and yield.

What we claim is:

1. A method of manufacturing a semiconductor device comprising the steps of providing a single crystal semiconductor substrate selected from the group consisting of gallium arsenide and gallium phosphide having a surface in a (001) plane in which a <001> orientation is defined as a fourfold rotation inversion axis, coating a protective film on said surface of said (001) plane, removing that part of the protective film which is defined between two straight lines parallel with the <100> orientation and between two straight lines parallel with the <010> orientation, so as to expose that part of said surface in said (001) plane, etching said exposed part of said surface in said (001) plane using a reaction-limited etching solution to form an etched groove, and forming a single crystal semiconductor by epitaxial growth in said etched groove.

2. A method according to Claim 1 wherein said exposed part of said surface in said (001) plane is etched using a reaction-limited etching solution having an activation energy of 10 Kcal./mol minimum.

References Cited

UNITED STATES PATENTS

| | | | |
|---|---|---|---|
| 3,447,235 | 6/1969 | Rosvold et al. ---- | 148—175 X |
| 3,425,879 | 2/1969 | Shaw et al. ------- | 117—106 X |

OTHER REFERENCES

Shaw: "Selective Epitaxial Deposition of GaAs in Holes," in *Journal of the Electrochemical Society,* September 19606, vol. 113, No. 9, pp. 904–908.

Faust and Sagar: *Effect of the Polarity of the III–V Intermetallic Compounds on Etching,* J. of Appl. Phys., vol. 31, No. 2, February 1960, pp. 331–333.

White and Roth: *Polarity of Gallium Arsenide Single Crystals,* J. Appl. Phys., 30, 946 (1959).

ALFRED L. LEAVITT, Primary Examiner

D. A. SIMMONS, Assistant Examiner

U.S. Cl. X.R.

117—8, 106 A; 148—1.6; 156—7, 17